US006255721B1

(12) United States Patent
Roberts

(10) Patent No.: US 6,255,721 B1
(45) Date of Patent: Jul. 3, 2001

(54) METHOD AND TOOL FOR HANDLING MICRO-MECHANICAL STRUCTURES

(75) Inventor: David D Roberts, Santa Cruz, CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/353,213

(22) Filed: Jul. 14, 1999

Related U.S. Application Data

(62) Division of application No. 08/908,648, filed on Aug. 7, 1997, now Pat. No. 5,966,591.

(51) Int. Cl.⁷ .................................................. H01L 29/72
(52) U.S. Cl. ...................... 257/670; 257/347; 257/618; 257/689; 257/735; 257/773
(58) Field of Search .................................... 257/618, 347, 257/670, 689, 735, 773

(56) References Cited

U.S. PATENT DOCUMENTS

| | | | |
|---|---|---|---|
| 3,770,531 | * 11/1973 | Craft et al. | 438/464 |
| 5,174,012 | * 12/1992 | Hamilton | 257/347 |
| 5,185,292 | * 2/1993 | Van Vonne et al. | 438/464 |
| 5,275,958 | * 1/1994 | Ishikawa | 438/462 |
| 5,479,694 | * 1/1996 | Baldwin | 257/347 |
| 5,567,332 | * 10/1996 | Mehta | 257/348 |

* cited by examiner

Primary Examiner—Edward Wojciechowicz
(74) Attorney, Agent, or Firm—Samuel A. Kassatly

(57) ABSTRACT

A method of forming and handling an array of micro-devices such as thin film devices that enables simultaneous mass handling and processing of these thin film devices. A plurality of micro-devices and links are simultaneously formed on a wafer, with the links interconnecting the micro-devices for maintaining a unitary array structure. A matrix of magnetic strips is then formed to impart added overall tensile strength to the array. The magnetic strips are secured to the links and form a planar support grid therewith. The array of micro-devices is then released from the wafer and lifted therefrom by means of a magnetic pick-up tool. Using the pick-up tool, the array is transferred onto a magnetic chuck which securely retains the array. Conductive wires are bonded to a row of micro-devices which are then separated from the array into individual micro-devices.

15 Claims, 7 Drawing Sheets

METHOD AND TOOL FOR HANDLING MICRO-MECHANICAL STRUCTURES

CROSS REFERENCE TO RELATED APPLICATIONS

This is a divisional of U.S. patent application, Ser. No. 08/908,648, now U.S. Pat. No. 5,966,591 issued Oct. 12, 1999 filed on Aug. 7, 1997, and titled "Method And Tool For Handling Micro-Mechanical Structures", which is incorporated herein by reference in its entirety.

The present patent application relates to patent application titled "Magnetic Coil Assembly", by Peter Bischoff and Chak Man Leung, Ser. No. 08/844,003, filed on Apr. 18, 1997, and which is incorporated herein by reference.

BACKGROUND OF THE INVENTION

1. Field of the Invention

This invention relates to the field of micro-mechanics. It particularly relates to a method and tool for handling micro-mechanical structures such as thin film micro-devices, and further to micro-mechanical structures made according to this method. This invention more specifically relates to a method for processing magnetic coil assemblies for use in data read-write heads.

2. Description of Related Art

In the field of miniaturization there is a growing interest in manufacturing micro-mechanical structures on the scale of micrometers. Many of these miniature structures are thin film devices made using semiconductor processing techniques. One of the critical steps in the manufacturing of these miniature structures involves the simultaneous handling of numerous miniature structures to enable mass-production.

U.S. Pat. No. 5,174,012 to Hamilton, which is incorporated herein by reference, describes an integrated head/flexure/conductor structure for the reading and writing information with respect to a relatively moving medium, and a method for manufacturing the same. The proposed structure takes the form of a micro-dimension, elongate, dielectric flexure body. Embedded within such body, a magnetic read/write pole structure and an electrical coil and conductor structure are operatively associated with the pole structure. The flexure body and the embedded constitutes are formed on an atom-by-atom basis utilizing one or more conventional material-deposition processes. The method of the invention is employable, as well, to create read/write structural components which may be less than a fully integrated read/write head/flexure/conductor structure.

U.S. Pat. No. 5,479,694 to Baldwin, which is incorporated herein by reference, describes a method for mounting an integrated circuit device onto a printed circuit board (PCB) by inducing a magnetic field of a selected strength at the surface of the PCB to temporarily hold the IC device onto the PCB. The IC device is provided with magnetic material which is attracted by the magnetic field. The magnetic field is maintained while the IC device and PCB are tested, and then subsequently during soldering when the IC device is permanently bonded to the PCB.

U.S. Pat. No. 5,567,332 to Mehta, which is incorporated herein by reference, describes a gaseous process for removing and vaporizing a portion of a silicon oxide film from between a substrate and a superstructure leaving a space between the substrate and the superstructure. The silicon oxide layer is removed in two steps. In the first step the bulk of the silicon oxide layer is removed by a rapid liquid or gaseous etching process, leaving a portion of the silicon oxide layer directly underlying the superstructure in place so as to support the superstructure during a wash cycle. In the second silicon oxide removal step the substrate is introduced to a high flow rate gaseous environment containing a relatively high concentration of anhydrous HF to which no, or only a relatively very low amount of, additional water vapor is provided until the silicon oxide directly underlying the superstructure has been removed.

As micro-mechanical structures are becoming smaller, lighter and more fragile, handling has become a serious problem from the standpoint of post wafer release processing. The size of these structures renders their mass production impractical when each miniature structure is handled individually. For instance, when a thin film device is selected it is broken away from the array of thin film devices using various techniques. However, the separation of the individual miniature structure may impart damage to that structure, or may cause it to be lost. In addition, cleaning, handling and testing the individual miniature device represent a very tedious and difficult task, and a potential source of contamination.

Therefore, there is still a great and unsatisfied need for a method and tool for handling and processing micro-mechanical structures such as thin film devices during the manufacture process.

SUMMARY OF THE INVENTION

One aspect of the present invention is to provide an array of micro-devices such as thin film devices that enables simultaneous mass handling and processing of these thin film devices.

Another aspect of the present invention is the inclusion of a magnetic or non-magnetic matrix that adds tensile strength to the array of micro-devices and that enables convenient handling, either manually or with a variety of tools such as a magnetic pick-up tool.

Yet another aspect of the present invention is to enable post-substrate release processing of the array of micro-devices such as rinsing, photoresist stripping, cleaning, and drying, without damaging this delicate array of micro-devices.

Still another aspect of the present invention is to enable convenient wire bonding, conformal coating, testing, and separation of the individual micro-devices from the array.

According to the present invention, a plurality of micro-devices and links are simultaneously formed on a wafer, with the links interconnecting the micro-devices for maintaining a unitary array structure. A matrix of magnetic strips is then formed to impart added overall tensile strength to the array. The magnetic strips are secured to the links and form a planar support grid therewith. The array of micro-devices is then released from the wafer and lifted therefrom by means of a magnetic pick-up tool. Using the pick-up tool, the array is transferred onto a magnetic chuck which securely retains the array. Conductive wires are bonded to a row of micro-devices.

BRIEF DESCRIPTION OF THE DRAWINGS

The features of the present invention and the manner of attaining them, will become apparent, and the invention itself will be understood by reference to the following description and the accompanying drawings, wherein.

Similar numerals refer to similar elements in the drawings. It should be understood that the sizes of the different components in the figures may not be in exact proportion, and are shown for visual clarity and for the purpose of explanation.

DESCRIPTION OF THE INVENTION

Figure 1:
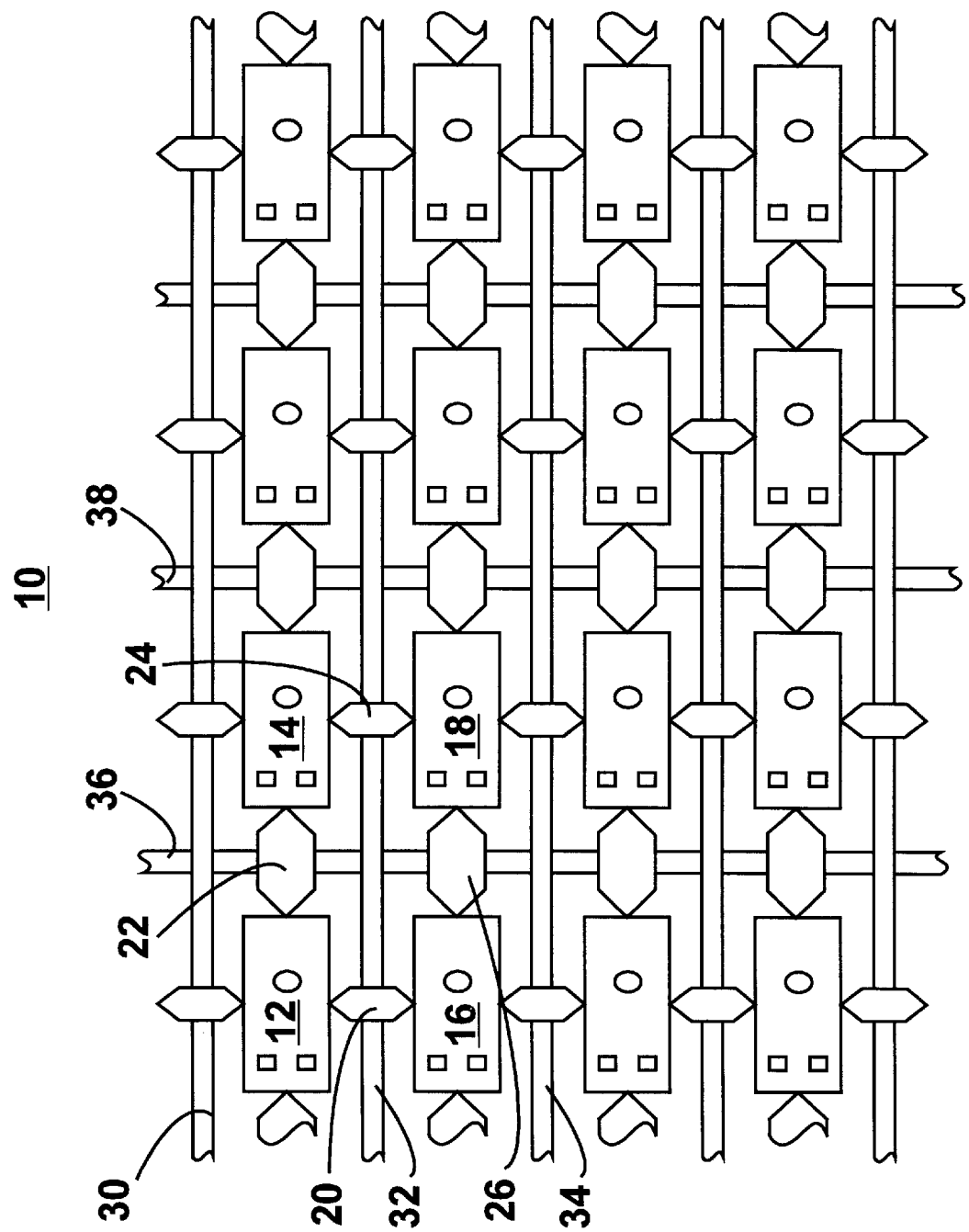
FIG. 1 is a top plan, partial view of an array of micro-devices made according to the present invention.

FIG. 1 represents a partial view of an array 10 formed according to the present invention. The array 10 is composed of a plurality of micro-devices, such as 12, 14, 16, 18 disposed in a matrix of rows and columns. Adjacent micro-devices, 12, 14, 16, 18 are separated by predefined distances, and are interconnected by means of a plurality of links, such as 20, 22, 24, 26, so as to facilitate the handling and processing of the entire array 10 prior to separating the individual micro-devices 12, 14, 16, 18.

In a preferred embodiment, the array 10 is further comprised of a matrix of strips, such as 30, 32, 34, 36, 38 that are networked to impart added overall tensile strength to the array 10. The strips 30, 32, 34, 36, 38 are interconnected, and are further connected to the links 20, 22, 24, 26. The strips 30, 32, 34, 36, 38 are made of magnetic material such as nickel iron (NiFe), to permit the handling of the entire array 10 by means of a magnetic pick-up tool 40 (FIG. 2), and its placement on a hard surface magnetic chuck 44 (FIG. 4) for processing and subsequent separation of the individual micro-devices 12, 14, 16, 18.

Figure 2:
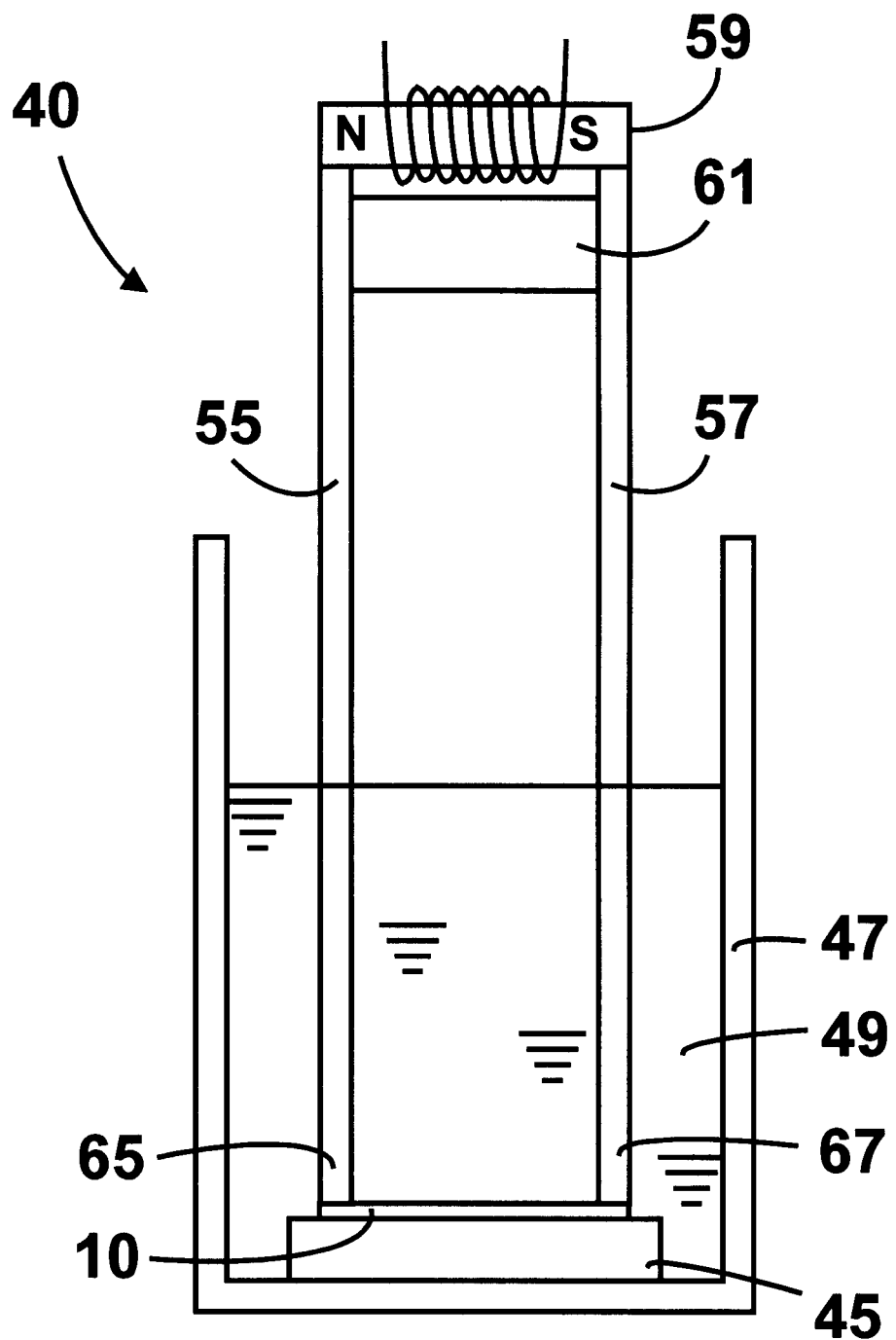
FIG. 2 is a schematic view of a pick-up tool according to the present invention, used in handling the array of FIG. 1.

Considering now the array 10 in more detail, it is formed using thin film processes. According to one such process, a thin metallic film of approximately 1000 Å is sputter or evaporation deposited on a wafer 45 (FIG. 2). The wafer 45 is then electroplated to form an etchable layer of copper approximately 3 to 20 microns thick. Aluminum oxide is then sputter deposited onto the layer of copper. The desired micro-devices 12, 14, 16, 18 are then formed as desired. The micro-devices 12, 14, 16, 18 may be magnetic coil assemblies as described in the U.S. patent application titled "Magnetic Coil Assembly", Ser. No. 08/844,003, or any other thin film device.

To this end, the wafer 45 is masked, and the aluminum oxide layer is then selectively etched to delineate the micro-devices 12, 14, 16,18 and the connecting links 20, 22, 24, 26. The fabrication of the micro-devices 12, 14, 16, 18 is then completed as desired, and the wafer 45 is metallized using sputtering or evaporation processes. The wafer 45 is masked and electroplated with a magnetic material, such as NiFe to form the magnetic strips 30, 32, 34, 36, 38.

As is illustrated in FIG. 2, the wafer 45 is immersed in a beaker 47 containing an etchant solution 49, with the array 10 facing upward, for dissolving the etchable layer of copper. When the etchable layer is completely or substantially dissolved by the etchant solution 49, the array 10 is released from the wafer 45. The etchant solution 49 is of a composition that selectively etches away copper but not magnetic material (i.e. NiFe). For instance the etchant solution 49 may have the following composition: 58 grams/liter $(NH_4)_2S_2O_8$–20 milliliters/liter $NH_4OH$. A magnetic pick-up tool 40 is used to lift the entire array 10 for further processing.

Figure 3:
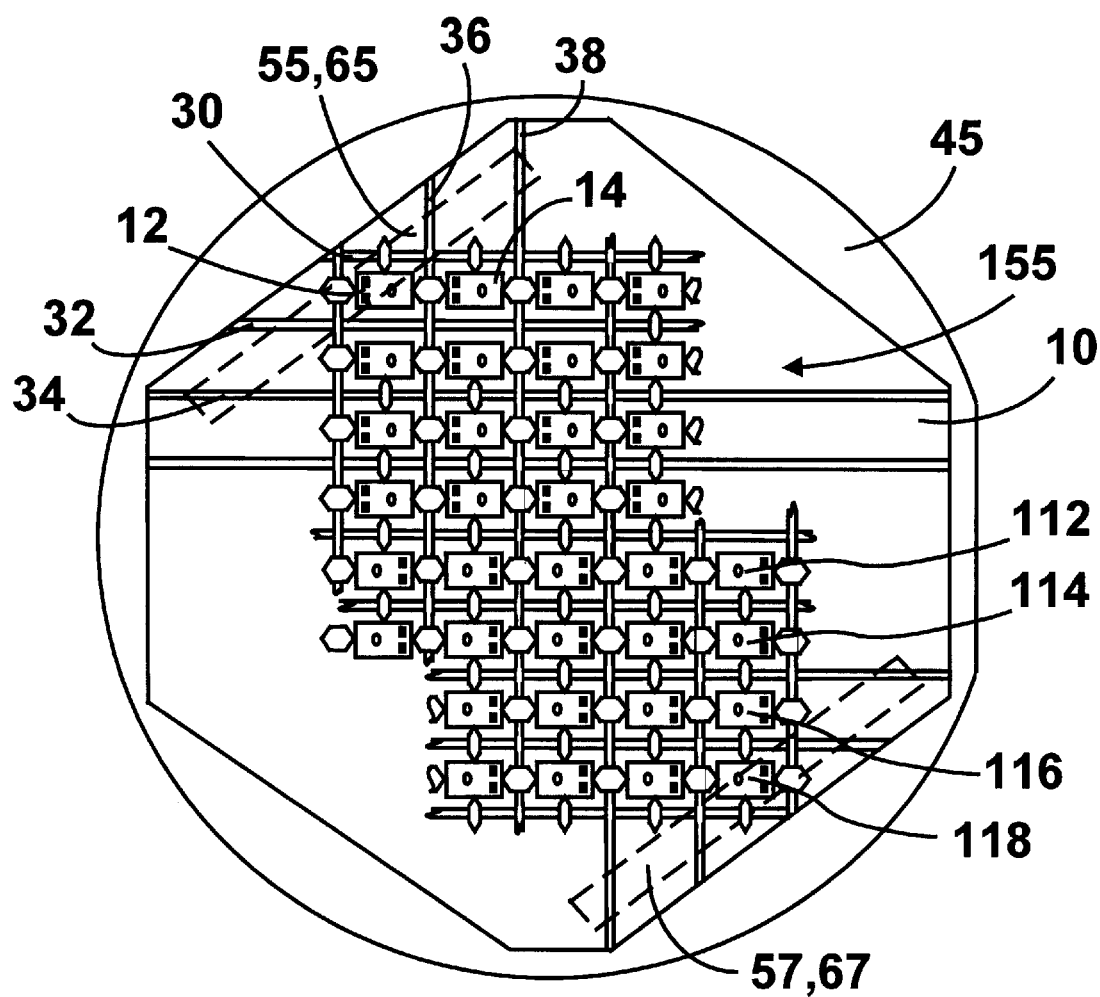
FIG. 3 is a top plan view of the array of FIGS. 1 and 2, showing two plates (in dashed lines) of the pick-up tool in magnetic attachment to the array.

With further reference to FIG. 3, the pick-up tool 40 includes two plates 55, 57 (shown in dashed lines) formed of soft magnetic material. A removable bar electromagnet 59 is positioned on a handle 61, in contact with the plates 55, 57 for applying a magnetic field at the distal ends 65, 67 of the plates 55, 57, respectively. The magnetic field generated by the pick-up tool 40 attracts the magnetic strips 30, 32, 34, 36, 38, etc. of the free or released array 10. The two plates 55, 57 are preferably positioned opposite each other to minimize the warping of the array 10.

The handle 61 is optional and enables the user to obtain a convenient grip on the pick-up tool 40. Alternatively, the entire handling process may be automated and the pick-up tool will be robotically maneuvered. In another embodiment where the array 10 does not include the strips 30, 32, 34, 36, 38, the released array 10 may be lifted manually or robotically. In yet another embodiment the pick-up tool 40 is formed of more than the two plates 55, 57. For instance, two additional magnetic or non-magnetic plates may be included for added support.

Upon lifting of the array 10 from the etchant solution 49, the array 10 is rinsed and dried. Excess photoresist material, if any, is dissolved, and the array 10 is rinsed and dried again, as needed.

Figure 4:
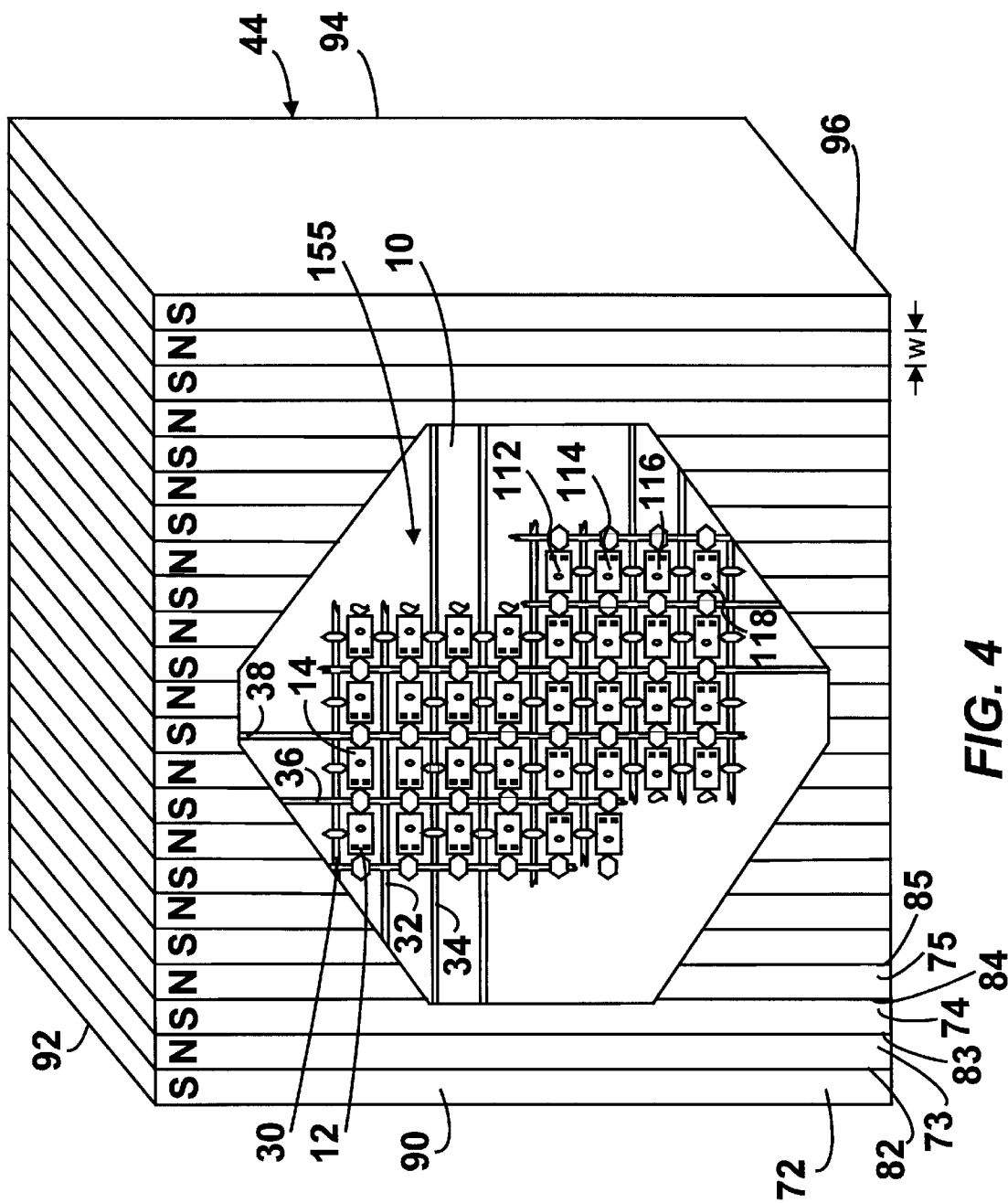
FIG. 4 is top plan view of the array of FIG. 1 shown positioned on a hard surfaced magnetic chuck, in preparation for wire bonding and separation.

Thereafter, and as illustrated in FIG. 4, the array 10 is positioned on, and transferred to a smooth, hard surfaced magnetic chuck 44, which retains the array 10 firmly for further processing and testing, as required. The magnetic chuck 44 is formed of a plurality of adjacently disposed laminates 72, 73, 74, 75 etc., with alternating poles (N, S). Adjacent laminates 72, 73, 74, 75 are secured together, for instance by bonding, along a plurality of bond or adhesive lines, such as 82, 83, 84, 85, etc. The laminates 72, 73, 74, 75 are made of a suitable magnetic material, such as bonded neodymium iron boron.

The magnetic chuck 44 has an upper surface or side 90 which is ground to a finished smooth surface upon which the array 10 is transferred. It should however be clear to a person of ordinary skill in the field that three other sides or surfaces 92, 94, 96 of the magnetic chuck 44 may be used for holding additional arrays 10. As a result, if practicable, it is possible to simultaneously use more than one surface of the magnetic chuck 44, thus further accelerating the post-release processing of the array 10.

Preferably, the laminates 72, 73, 74, 75 are identical and are as closely spaced as possible so as to increase the holding strength of the magnetic chuck 44. In one embodiment the width "w" of each laminate is approximately 80 mils (where 1 mil equals 1/1000 inch).

Figure 5:
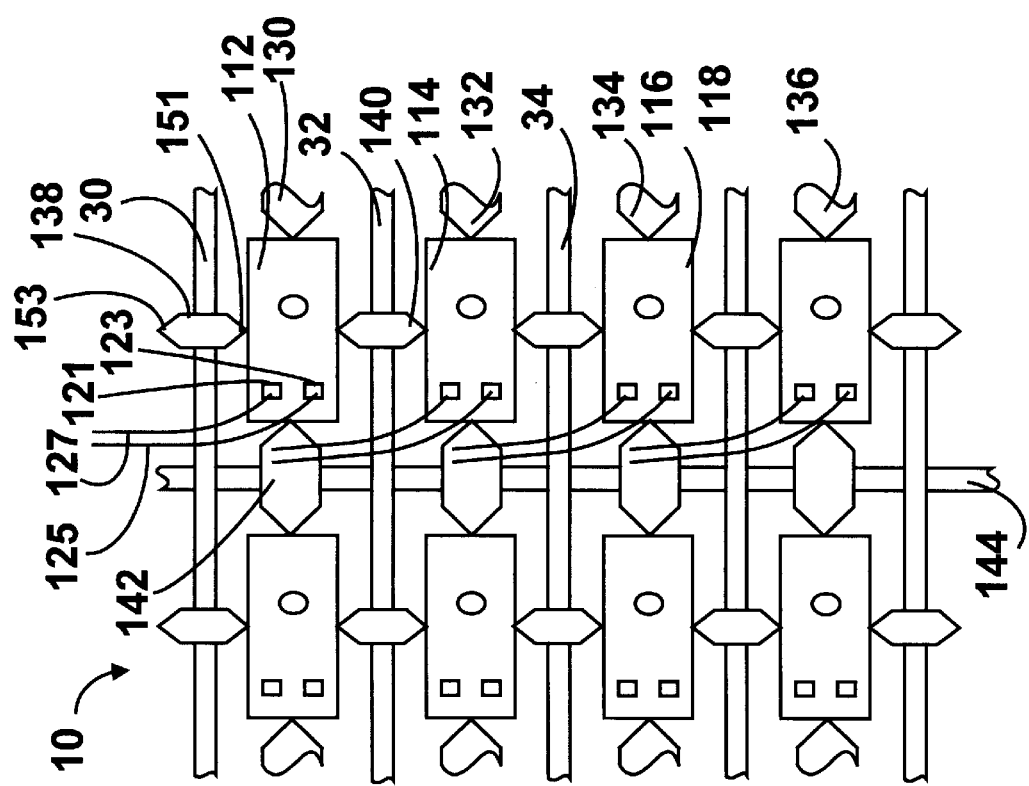
FIG. 5 is a partial top plan view of the array of FIG. 4 showing a first column of micro-devices subsequent to wire bonding but before separation from the array.
Figure 6:
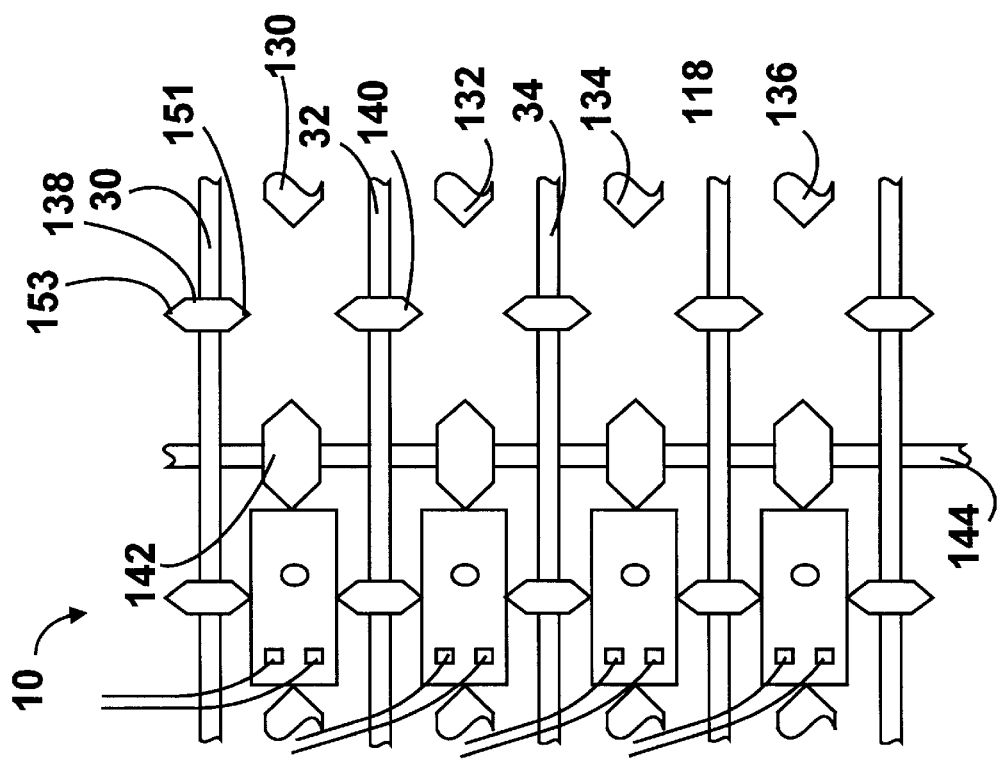
FIG. 6 is another partial view of the array of FIG. 5, subsequent to separation of the first wire bonded column of micro-devices, and further showing a second column of micro-devices subsequent to wire bonding but before separation from the array.

With reference to FIGS. 5 and 6, a certain number of micro-devices, i.e., 112, 114, 116, 118 in one or more columns (or alternatively one or more rows) are bonded to corresponding wires. For example, two bonding pads 121, 123 of micro-device 112 are bonded to conductive wires 125

127. If required, the micro-devices 112, 114, 116, 118 are then tested, even though these micro-devices may have been previously tested on the wafer fabrication level.

The wire bonded micro-devices 112, 114, 116, 118 are then coated with conformal coating, such as ultra-violet curable epoxy, for added protection, which coating is then cured. The micro-devices 112, 114, 116, 118 are then separated from the array 10, either individually or as a group. The separation may be performed manually by either pulling on the wires, i.e., 125, 127, or by means of a vacuum or magnetic pick-up tool, leaving undesired structures, such as the links, i.e., 130, 132, 134, 136, 140, 138, 142, and the strips, i.e., 30, 32, 34, 144 on the magnetic chuck 44. To this end, each link, for instance link 138 has two oppositely disposed attachment and breakoff sites 151, 153, one of which, i.e., 151, is connected to the micro-device 112, for providing a connecting link to hold the array 10 together as well as a natural break location, so that when the individual micro-device 112 is separated from the array 10, the break off point or site 151 is predictable.

The separated micro-devices 112, 114, 116, 118 are ready for use since they are not attached to undesired structures. Furthermore, since a laser is not used for the separation of the micro-devices 112, 114, 116, 118, it is now possible to avoid the deleterious aspects of the laser cutting process, such as application and cleaning of adhesive and laser burrs formed during the ablation of the alumina material. Also, after laser cutting and adhesive cleaning, the individual micro-devices 112, 114, 116, 118 are co-mingled with the dross, requiring tedious separation and handling. The separation of the micro-devices 112, 114, 116, 118 may also be done robotically.

According to one embodiment of the present invention the micro-devices 12, 14, 16, 18, 112, 114, 116, 118 are magnetic coil assemblies, each of which is approximately 200 by 800 microns with a thickness of approximately 20 microns. The length of each link 20, 22, 24, 26, 130, 132, 134, 136, 138, 140, 142 is approximately 200 microns. The strips 30, 32, 34, 36, 38, 144 traverse the entire surface of the array 10, and preferably, but not necessarily, they intersect each other at approximately 90 degree angles, to form a planar support grid or mesh 155 with the links 20, 22, 24, 26, 130, 132, 134, 136, 138, 140, 142. The grid 155 adds tensile strength to the entire array 10, and creates a magnetic path to allow the magnetic pick-up tool 40 to be used to lift the array 10 after its release from the wafer 45. Furthermore, the grid 155 forces the array 10 against the magnetic chuck 44. As an example, the strip 34 is approximately 170 microns wide.

Figure 7:
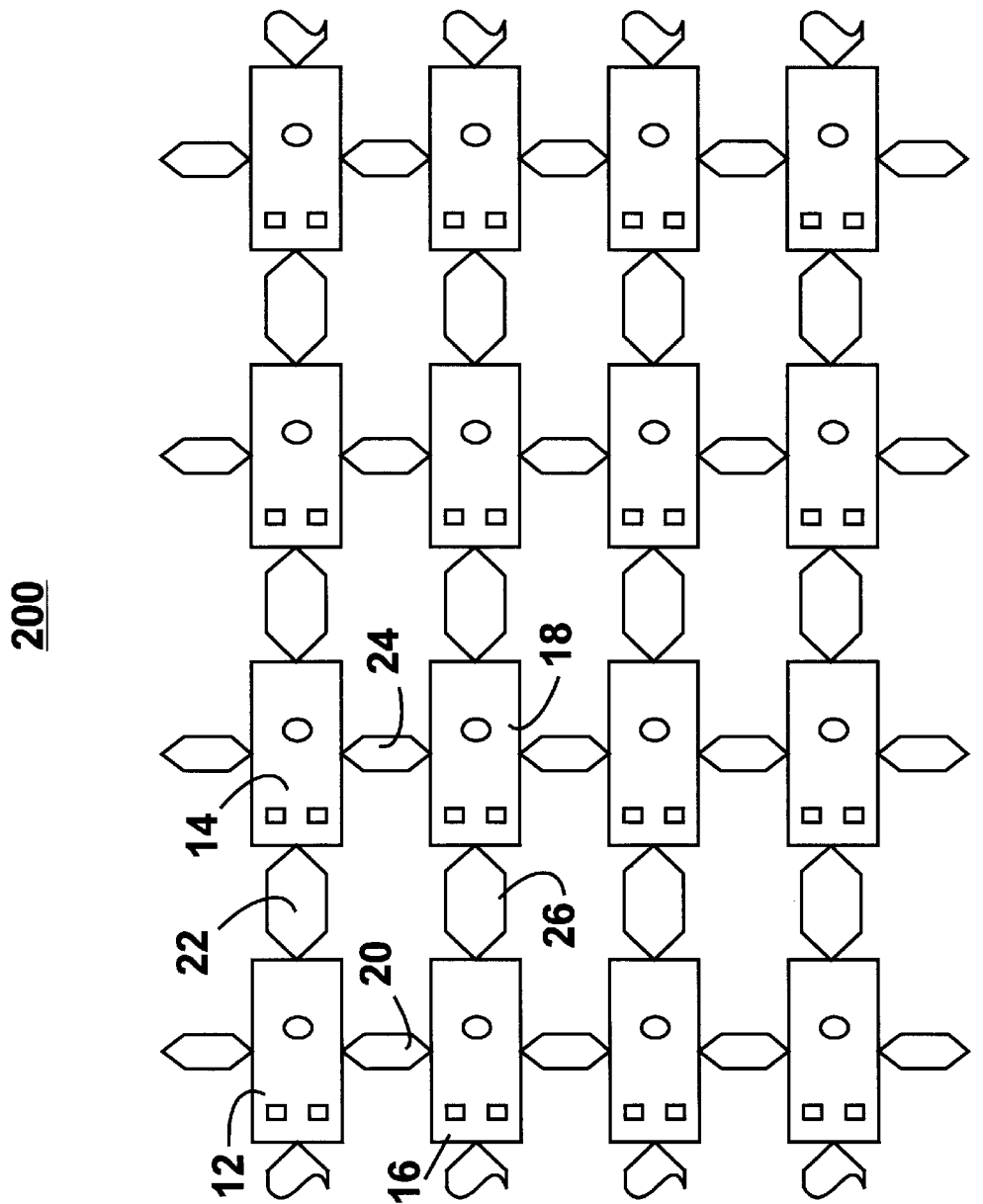
FIG. 7 is a top plan view of an alternative embodiment for an array of micro-devices made according to the present invention.

FIG. 7 illustrates another array 200 of micro-devices 12, 14, 16, 18, which is made according to another embodiment of the present invention. The array 200 is similar to the array 10, and is fabricated using similar processes, with the exception that the array 200 does not include the magnetic strips 30, 32, 34, 36, 38, 144.

It should be understood that the geometry, compositions, and dimensions of the elements described herein may be modified within the scope of the invention. Other modifications may be made when implementing the invention for a particular environment. In addition, while the invention has been described in connection with coil assemblies other devices may be fabricated using the present method.

What is claimed is:

1. An array of micro-devices comprising:
   a plurality of micro-devices formed on a wafer;
   a plurality of links interconnecting the plurality of micro-devices for maintaining a unitary array structure;
   a matrix of strips networked to impart added overall tensile strength to the array; and
   the plurality of micro-devices and the plurality of links beinq releasable from the wafer.

2. The array according to claim 1, wherein at least some of the strips are made of magnetic material.

3. The array according to claim 1, wherein the matrix of strips is connected to at least some of the plurality of links.

4. The array according to claim 1, further including an etchable layer formed on the wafer, intermediate the plurality of micro-devices and the wafer.

5. The array according to claim 4, wherein the plurality of micro-devices are released from the wafer by dissolving the etchable layer.

6. A micro-device made by:
   forming a plurality of micro-devices on a wafer;
   forming a plurality of links that interconnect the plurality of micro-devices for maintaining a unitary array structure;
   releasing the plurality of micro-devices and the plurality of links from the wafer;
   separating the plurality of micro-devices into individual micro-devices; and
   forming a matrix of magnetic strips that are networked to impart added overall tensile strength to the array;
   connecting the matrix of magnetic strips to the plurality of links; and
   releasing the plurality of micro-devices and the plurality of links.

7. A micro-device made by:
   forming a plurality of micro-devices on a wafer;
   forming a plurality of links that interconnect the plurality of micro-devices for maintaining a unitary array structure;
   releasing the plurality of micro-devices and the plurality of links from the wafer;
   separating the plurality of micro-devices into individual micro-devices; and
   using a magnetic pick-up tool to lift the entire array for further processing.

8. The micro-device according to claim 7, further formed by transferring the array onto a magnetic chuck which securely retains the array.

9. The micro-device according to claim 7, further formed by bonding wires to selected micro-devices.

10. The micro-device according to claim 9, further formed by testing the wire bonded micro-devices.

11. The micro-device according to claim 9, further formed by selectively separating the wire bonded micro-devices from the array.

12. The micro-device according to claim 6, further formed by transferring the array onto a magnetic chuck which securely retains the array.

13. The micro-device according to claim 6, further formed by bonding wires to selected micro-devices.

14. The micro-device according to claim 13, further formed by testing the wire bonded micro-devices.

15. The micro-device according to claim 13, further formed by selectively separating the wire bonded micro-devices from the array.

* * * * *